United States Patent Office 3,497,822
Patented Feb. 24, 1970

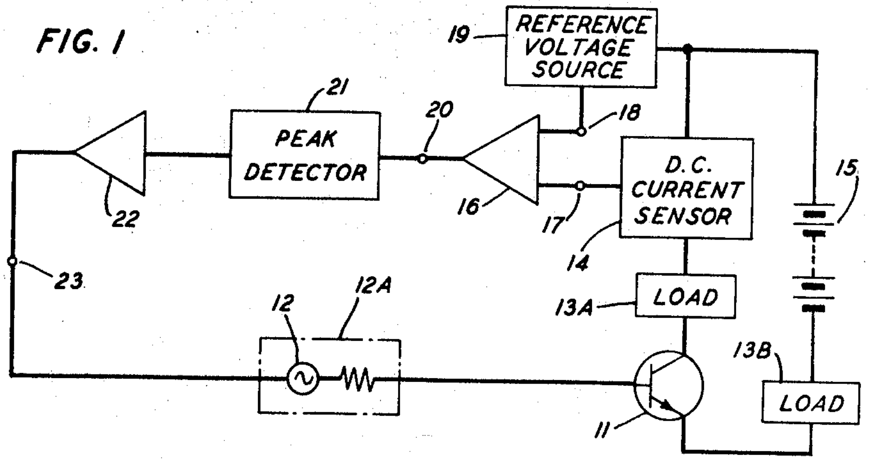
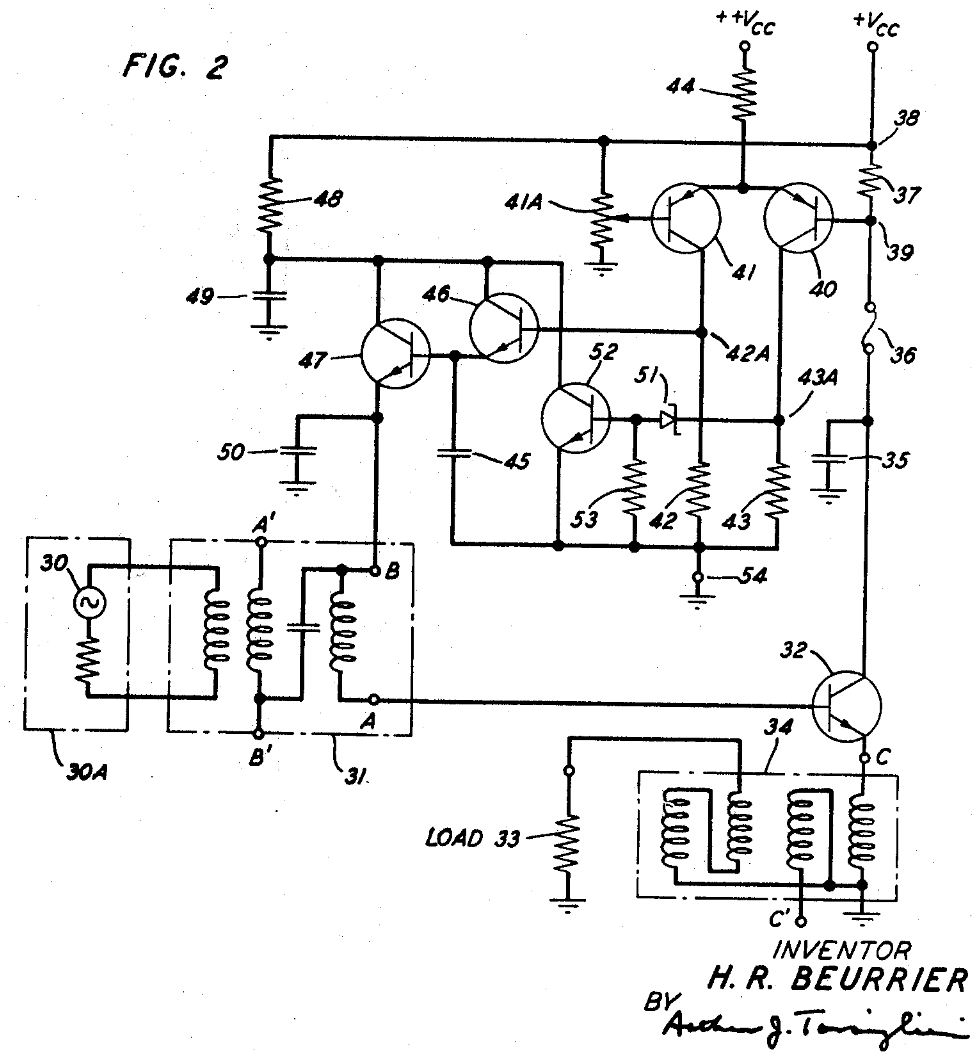
INVENTOR
H. R. BEURRIER
BY Arthur J. Torsiglieri
ATTORNEY

3,497,822
BIAS CONTROL CIRCUIT FOR PULSE POWER TRANSISTOR AMPLIFIERS TO STABILIZE THE QUIESCENT CURRENT THEREIN

Henry R. Beurrier, Chester Township, Morris County, N.J., assignor to Bell Telephone Laboratories, Incorporated, Murray Hill, N.J., a corporation of New York Filed May 10, 1968, Ser. No. 728,285
Int. Cl. H03g 3/30
U.S. Cl. 330—25 13 Claims

ABSTRACT OF THE DISCLOSURE

Disclosed herein is a base bias control circuit for pulsed signal power transistor amplifiers, especially those operating Class AB. The circuit supplies degenerative feedback to the base of the transistor, to stabilize the D.C. level of the current therein against thermally induced variations, while ignoring temporary variations in D.C. level therein caused by the pulsed signal itself (due to non-Class A operation). This is accomplished by putting in the feedback loop, a peak detector (similar to a diode A.M. detector in a receiver), whose time constant lies between the time constant of thermally induced variations and the maximum signal pulse width.

Field of the invention

This invention relates to pulsed signal power transistor amplifiers having D.C. feedback bias control for stabilization of the quiescent operating current, especially in Class AB operation.

Description of prior art

In Class AB operation, power amplifiers exhibit adverse effects brought about by temperature changes, aging changes and semiconductor "device to device" parameter differences. These changes cause undesired changes of the bias condition and subsequently in the quiescent and active operating average direct current level of the transistor. In pulsed Class AB operation, another disruptive influence in the bias point comes about due to changes in transistor average direct current occurring during input signal pulses.

For the purpose of simplifying the following discussion, all changes caused by input signal disruption will be referred to as "signal induced," while changes brought about by temperature variations will be referred to as "thermally induced."

Prior art circuits, for providing stable operating conditions by way of negative feedback, fail to operate under Class AB conditions or suffer from thermally induced problems within the feedback loops. Some forms which operate satisfactorily under "continuous wave" signal conditions or fixed duty cycle pulsed conditions, fail under conditions of varied duty cycle. Even with a fixed duty cycle many forms of bias control are upset during the period of the signal pulse and cause signal distortion.

Summary of this invention

In accordance with this invention, the "quiescent current" (D.C. current level) in a pulsed signal power transistor amplifier is detected by a direct current sensor. This sensor may be provided, for example, by the signal bypassed voltage drop across a low resistance connected serially in the emitter or collector network (i.e., high current carrying networks) of the transistor. The output of this sensor is fed into an amplifier of a thermally stable type, preferably a differential amplifier. An offset voltage is provided either inherently by this amplifier, or by an auxiliary means. The output of this differential amplifier is fed to a peak detector (similar to a diode Amplitude Modulation detector in a receiver). The elements constituting the peak detector are selected to yield a time constant thereof which is intermediate between the largest pulse width of the signal to be used and the time constant of "thermally induced" variations. Advantageously, the time constant of the peak detector is at least an order of magnitude larger than the largest signal pulse width and at least an order of magnitude smaller than the time constant of thermally induced variations to be expected.

It should be understood, of course, that variations due to aging of the transistor ("parameter changes"), have a time constant which is larger yet than that of thermally induced variations. Hence, the aforementioned time constant of the peak detector will automatically be very much smaller than the time constant of parameter changes. For further simplifying the following discussion, changes in the circuit caused by aging and replacement of the power transistor will also be included under the phrase "thermally induced."

In its simplest form, the peak detector is simply a capacitor fed by a diode. Preferably, the function of the diode is assumed by a "peak detection" transistor in a quasi emitter follower configuration. This arrangement permits the peak detection transistor to charge a capacitor through emitter follower action, with its concomitant current gain, when the base of this transistor is driven positive (assuming an NPN transistor). When this base is then driven negative, the peak detection transistor is cut off by virtue of the emitter voltage being held positive by the charge in the capacitor. In this manner, the peak detection transistor acts as a diode detector having current gain.

The output of the peak detector is then fed to the base of the power transistor, preferably through a control transisor which serves as a current amplifier, to reduce the capacitance value required in the peak detector for a given time constant, among other functions.

The output of the differential amplifier is arranged in relation to the peak detector so that the feedback to the base of the power transistor (through the peak detector and control amplifier) is degenerative ("negative feedback"); that is, the feedback to the base tends to minimize variations in the D.C. quiescent current level of the power transistor. The peak detector will be insensitive to the sudden negative going signal induced inputs, provided the time constant of said peak detector is as specified above. Thus, the quiescent current is stabilized against "thermally induced" variations.

The above described circuit may also be used for Class A operation of the power transistor, in which case the peak detector may be omitted from the feedback loop.

This invention may be better understood from the following detailed description when read in conjunction with the drawings in which:

FIG. 1 is a block pictorial representation of an embodiment of this invention;

FIG. 2 is an electrical schematic diagram of a specific embodiment of this invention.

Figure 3:
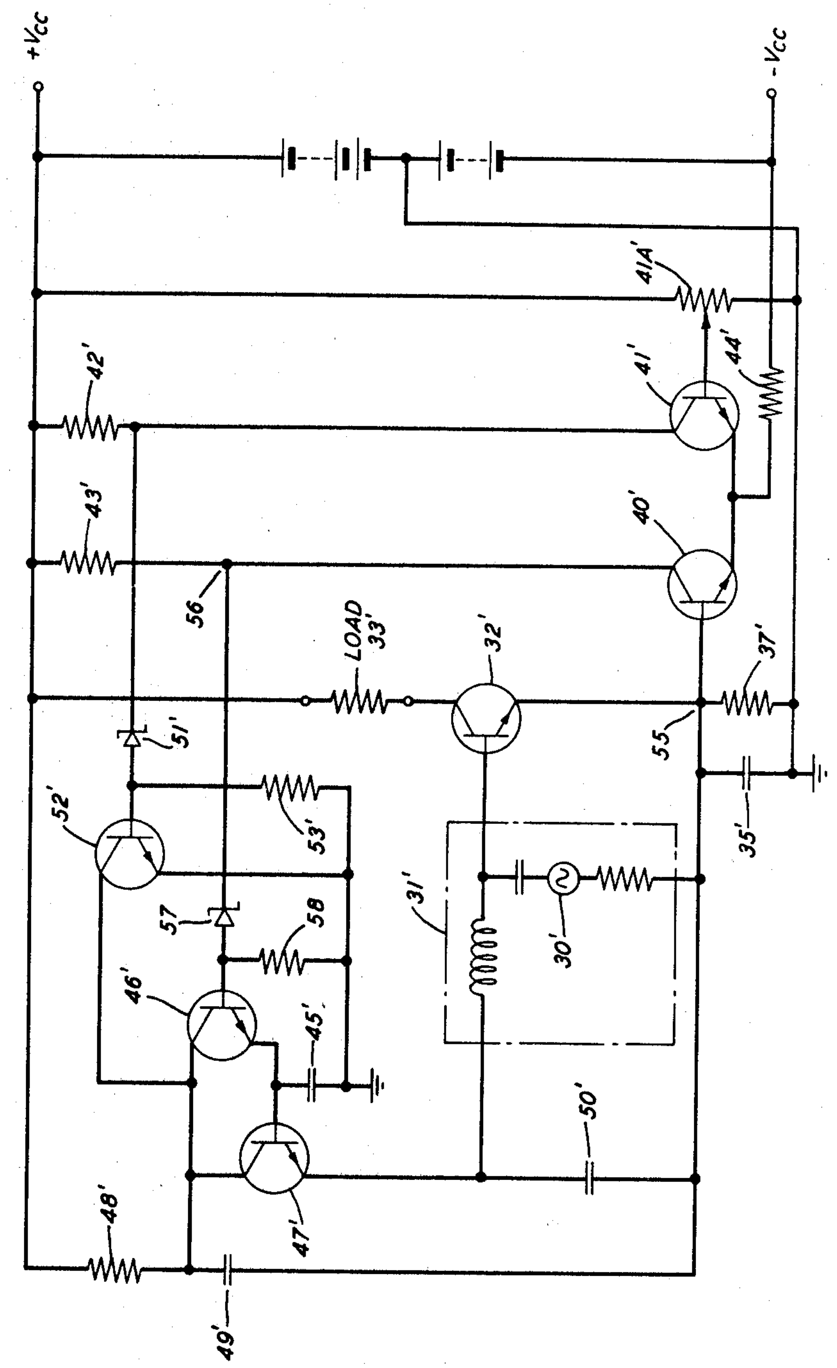
FIG. 3 is an electrical schematic diagram of another specific embodiment of this invention.

Referring to FIG. 1, the base of the NPN power transistor 11 is driven by a pulse signal source 12 in the input signal network 12A, under Class AB conditions as known in the art. The output of the power transistor may be taken from the collector circuit, i.e., load 13A, or from the emitter circuit; i.e., load 13B, or from both. Voltage source 15 supplies collector voltage bias for the transistor 11 through the current sensor 14 and the loads 13A and 13B.

Current sensor 14 is responsive to the average D.C. level of collector current of power transistor 11, and insensitive to signal frequency components. The output of the current sensor 14 is a voltage proportional to this average collector current and is coupled to input terminal 17 of a thermally stable differential amplifier 16. The other input terminal 18 of the differential amplifier 16 is connected to a reference voltage source 19. Any voltage difference between terminals 17 and 18 results in a change in the output at terminal 20 of the differential amplifier 16. This output is fed to a peak voltage detector 21 which is in turn connected to control amplifier 22. Thus, the input to the control amplifier 22 is the output of the peak detector 21.

The output of control amplifier 22 is fed back through the input signal network 12A to the base of power transistor 11 in such a phase as to oppose any collector current changes in power transistor 11. Thus, in its simplest sense, an amplified form of "negative" voltage feedback bias control is effected. More specifically, the feedback circuit on a long time basis controls the current in the power transistor 11, such that the voltage output of current sensor 14 is made to match the voltage of reference source 19.

When an input signal appears in network 12A, a relatively sudden (signal induced) increase in average collector current in power transistor 11 is effected, which results in a sudden negative going voltage output from the differential amplifier 16 which is coupled to peak detector 21. Since the peak detector 21 is responsive, on a long term basis, only to the peak quasi static quiescent collector current condition at the power transistor, it ignores this sudden negative change and continues to transmit a relatively fixed output voltage to control amplifier 22.

Control amplifier 22 maintains, in turn, a relatively fixed value of voltage at point 23. Thus, an undisturbed bias condition in the power transistor 11 is maintained during the input signal pulse.

Time constants in the circuit, as mentioned earlier, are such that thermally induced changes in any part of the loop are compensated for and the quiescent collector current is maintained at a fixed level determined by the reference voltage 19 and current sensor 14. Advantageously the time constant of the peak detector 18 is at least an order of magnitude larger than the largest signal pulse width and at least an order of magnitude smaller than the time constant of thermally induced variations.

FIG. 2 shows a specific embodiment of the invention. In particular, it shows one-half of a push-pull Class AB emitter follower power amplifier circuit, in which it is to be understood that the other half (not shown) is a mirror image of same, and is connected into the circuit at terminals A′, B′, and C′; the mirror images of terminals A, B, and C, respectively.

The pulsed signal source 30 in the input signal network 30A, feeds signals to the circuit shown in FIG. 2 by way of inductive coupling furnished by the transformer 31, as known in the art. The signal is then fed to the base of the power transistor 32. The output of this power transistor 32 is fed to the load 33 by means of the inductive coupling furnished by the transformer 34, in an emitter follower arrangement, i.e., having the load 33 connected in the emitter network of the power transistor 32.

The collector of the power transistor 32 is connected to a signal by-pass capacitor 35, and a fuse 36. In turn, the fuse 36 is connected to a resistor 37, which may have a relatively low resistance. This resistor 37 serves to sense the quiescent direct current level in the power transistor 32. Bias voltage $+V_{cc}$ for the collector of the power transistor 32 is supplied to terminal 38 of the resistor 37. The voltage at terminal 39 of the resistor 37 is a measure of said quiescent current; a variation in said current producing a variation in said voltage which is proportional thereto. The terminal 39 is connected to the base of a transistor 40. Transistor 40 in conjunction with a substantially identical transistor 41, which is preferably thermally connected to transistor 40 to ensure thermal stability, forms a differential amplifier arrangement, as known in the art. The potentiometer 41A serves to provide a reference base bias voltage for transistor 41. The output of the differential amplifier is developed across resistor 42, which is substantially identical to resistor 43. Resistor 43 acts as a dummy load to equalize power dissipation in transistors 40 and 41, as known in the art. Thus, this output of the differential amplifier is an amplified function of variations in the quiescent current of power transistor 32. Resistor 44 has a high value of resistance which makes it in conjunction with the voltage source $++V_{cc}$ essentially a constant current source for the emitters of transistors 40 and 41; so that the sum of currents in resistors 42 and 43 is substantially constant. A convenient offset voltage is provided by the base to collector voltage of the transistor 41.

The voltage at terminal 42A generated across resistor 42 is connected to capacitor 45 and the base of control transistor 47 through the peak detection transistor 46. The operation of transistor 46 is as a quasi emitter follower and acts much the same as a diode with the exception that essentially all of the charging current for capacitor 45 is drawn from the collector supply source for transistor 46 rather than from transistor 41.

When the base of the peak detection transistor 46 is driven positive, by an amount greater than the base-emitter voltage ($V_{BE}$) of transistor 46, plus the voltage across capacitor 45, transistor 46 conducts and thereby supplies charging current for capacitor 45 through emitter follower action. On the other hand, when the base of transistor 46 is suddenly driven negative, due to the presence of a momentary signal induced increase of current in the power transistor 32, the voltage across capacitor 45 remains essentially constant; which results in a reverse bias on the base-emitter junction of transistor 46. This reverse bias switches off this transistor 46, which in effect presents a high impedance between the base of transistor 46 and capacitor 45, which prevents a sudden discharge of capacitor 45. It is through this diode-like action that the bias circuit has the ability to ignore momentary signal induced changes in the average current in the power transistor 32.

Transistors 46 and 47 obtain their collector voltage through the voltage dropping resistor 48 as is shown in FIG. 2, to reduce power dissipation in transistors 46 and 47.

The time constant of the peak detector is determined by the capacitance of capacitor 45 and the input impedance of transistor 47, and lies intermediate between the maximum signal pulse width and the time constant of the expected thermally induced variations in power transistor 32.

Control transistor 47 is connected as an emitter follower to current-amplify the output of the peak detector. The high input impedance of the emitter follower serves to reduce the capacitance of capacitor 45 for a given time constant, a practice that is known in the art. The emitter follower amplifier arrangement for transistor 47 was also chosen to minimize the direct upsetting effect on the bias voltage point of the power transistor 32 during signal input pulses, caused by undesired "self-biasing" tendencies of Class AB, B, and C amplifiers.

The output at the emitter of transistor 47 is fed through the low D.C. impedance of transformer 31 to the base of transistor 32, thus closing a degenerative feedback loop. This feedback maintains the power transistor 32 at a relatively constant level of bias in the face of thermally induced variations, including also aging and replacement; while having the ability to ignore signal induced variations, and also minimizing the direct disruptive influence of signal on the bias point.

Capacitor 49 is a power supply decoupler and should provide a time constant with resistor 48 and transistors 46 and 47 which is long compared to the maximum signal pulse width. Capacitor 50 is a signal by-pass capacitor.

Adjustment of the potentiometer 41A is required to establish the quiescent current for power transistor 32. Once the above adjustment is made, any electrical element situated between transistor 41 and point 39, as well as the power transistor 32, may experience normal changes due to temperature, aging, or replacement without resetting the potentiometer 41A.

For overcurrent protection of the power transistor 32, caused by excessive input signal levels, overdrive protection is afforded by additions to the circuit consisting of avalanche diode 51 and overdrive protection transistor 52.

The voltage variation, caused by input signal pulses in resistor 43, is opposite in phase to the variation in resistor 42, so that large input signal pulses cause positive going voltage pulses to be generated across resistor 43 which is proportional to the amplitude of said input signal pulses. When this voltage exceeds a predetermined value, which would represent an excessive amount of current in the power transistor 32, the breakdown or avalanche diode 51 is cuased to conduct. Conduction of avalanche diode 51 biases the base of the protection transistor 52 positive, which causes this protection transistor 52 to conduct, thus lowering the collector voltage of transistors 47 and 46. This in turn spoils the ability of transistors 47 and 46 both to "ignore" the presence of input signal pulses and to resist self-biasing of the power transistor 32. Thereby, the bias point of power transistor 32 is permitted to go in a negative direction, thus reducing the gain of the power transistor 32 to a value where a safe value of current is drawn by this power transistor 32.

Resistor 53 ensures that transistor 52 is nonconducting when avalanche diode 51 in nonconducting. To utilize more fully the overdrive protection afforded thereby, the common point 54 of resistors 42, 43 and 53, and capacitor 45 should be connected to a negative voltage source, rather than be grounded as shown in FIG. 2. This allows the base bias of the power transistor 32 to become more negative during overdrive, further reducing the current in the power transistor 32.

If overdrive protection is not desired, resistor 53, transistor 52, and avalanche diode 51 may all be omitted. Resistor 43, however, should advantageously be left in the circuit; since the resistor 43 provides a dummy load for transistor 40 and helps equalize power dissipation and temperature of transistors 40 and 41.

In those cases where overdrive protection is omitted, instead of the arrangement shown with resistor 48 in FIG. 2, the collector voltage for transistors 46 and 47 could be provided by a separate fixed voltage source of somewhat lower voltage than that supplied for the collector of the transistor 32. However, such a fixed source should be of sufficiently high voltage to ensure proper operation of these transistors 46 and 47, but low enough to minimize their collector dissipation. Resistor 48 and capacitor 49 could then be omitted.

Another cricuit alternative is to replace resistor 44 with a constant current transistor network, which is a technique well known by those versed in the art.

In the circuit shown in FIG. 2 the following is a table of circuit components found useful therein for power amplification of signals of about 30 mHz. in conjunction with the power transistor 32 selected as 2N3632, and the other transistors, as ordinarily available signal transistors.

| | | |
|---|---|---|
| Capacitors **35**, **49**, **50** | μf. each | 5 |
| Resistor **37** | Ω | 15 |
| Resistors **42**, **43** | KΩ each | 1 |
| Resistor **41A** | KΩ | 48 |
| Resistor **44** | K | 6.8 |
| Capacitor **45** | μf | 100 |
| Resistor **48** | KΩ | 1 |
| Resistor **53** | KΩ | 10 |
| $+V_{cc}$ | v | +24 |
| $++V_{cc}$ | v | +48 |

Although the power transistor 32 is shown in FIG. 2 in a common collector configuration, this circuit may be modified for either common base or common emitter configurations or combinations thereof, as should be obvious to those skilled in the art.

Another version of the bias circuit of this invention is shown in FIG. 3, which utilizes power transistor current sensing in the emitter circuit; as opposed to the previously described circuit shown in FIG. 2, which employed collector sensing. Also by way of illustration, the load 33' is shown in the collector circuit.

Since the operation of the circuit shown in FIG. 3 is very similar to that shown in FIG. 2 and previously described, only the different aspects of operation will be mentioned herein. All components which have similar functions to those in FIG. 2 are designated with the same reference number, except for the addition of primes. Note that for the NPN power transistors 32 and 32' shown in FIGS. 2 and 3, respectively, the transistors 40 and 41 in the differential amplifier shown in FIG. 2 are PNP, whereas they are NPN in FIG. 3. Corresponding differences in the voltage supply are therefore shown.

The main difference in operation lies in the fact that the D.C. level at terminal 56 in the circuit shown in FIG. 3 is not at as convenient a level as was the corresponding point 42A in the circuit shown in FIG. 2. In most practical applications this D.C. level would be too positive to permit proper operation of the circuit shown in FIG. 3 and should be made more negative by the interposition of a fixed voltage between point 56 and the base of peak detection transistor 46'. This D.C. voltage interposition, or offset, may be implemented by the addition of avalanche diode 57, as shown in FIG. 3. Alternatively, a battery, or a string of one or more forward biased diodes, may be added for this purpose. Note that the output of the differential amplifier is taken from transistor 40' rather than 41' in the circuit shown in FIG. 3. Resistor 58 provides a minimum value of current through the avalanche diode 57 to maintain its breakdown (fixed voltage) condition.

Addition of overdrive protection to the emitter sensed version of the bias circuit shown in FIG. 3 is much the same as in the collector sensed circuit shown in FIG. 2. The overdrive control signal should, however, be derived across resistor 42' in order to have the proper sense in the circuit shown in FIG. 3.

It should be understood that many modifications of this circuit may be made within the spirit and scope of this invention without departing therefrom.

What is claimed is:

1. A bias control network for a pulsed signal power transistor amplifier, for stabilizing the direct current level therein, comprising:

(a) sensing means of the direct current level in the power transistor, having an output whose variations are proportional to the variations in the direct current level;

(b) an offset voltage means;

(c) a peak detector, having a time constant which is intermediate between the maximum signal pulse width and the time constant of thermally induced variations in the said direct current level;

(d) means for connecting the output of the sensing means serially through the offset voltage means and the peak detector to the base terminal for the power transistor, thereby providing peak detected degenerative feedback thereto in order to stabilize the direct current level.

2. The network of claim 1 in which the offset voltage means includes an amplifier of the output of the sensing means.

3. The network of claim 1 in which the peak detector includes a control amplifier at the output side of the peak detector.

4. The network of claim 1 in which the peak detector comprises the base to emitter interaction of a control transistor, capacitive means, and means for connecting said capacitive means with the emitter of said control transistor.

5. The network of claim 1 in which the time constant of the peak detector is at least an order of magnitude greater than the maximum signal pulse width, and is at least an order of magnitude smaller than the time constant of thermally induced variations in the said current level.

6. A signal pulse power transistor amplifier circuit with stabilized base bias, comprising:

(a) the network of claim 1;
(b) the power transistor;
(c) means for connecting the power transistor to the sensing means; and
(d) means for connecting the base of the power transistor to the base terminal for the power transistor.

7. A signal power transistor circuit with stabilized base bias, comprising:

(a) the circuit of claim 6;
(b) a signal input network;
(c) means for connecting the signal input network to the base of the power transistor;
(d) an output utilization load; and
(e) means for connecting the load to the power transistor.

8. A bias control network for a pulsed signal power transistor amplifier, for stabilizing the direct current level therein, comprising:

(a) sensing means of the direct current level in the power transistor;
(b) a differential amplifier, responsive to said sensing means, for producing a control current whose variations are proportional to variations in said direct current level in the power transistor;
(c) a peak detector responsive to said control current, said peak detector having a time constant which is large compared with the signal pulse widths but is small compared with the time constant of thermally induced variations in the said direct current level in the power transistor, the output of said peak detector thereby being nonresponsive to changes in the control current caused by signal induced changes in the said D.C. level in the power transistor but responsive to the thermally induced variations thereof; and
(d) means for connecting the output of said peak detector to the base terminal of the power transistor, thereby feeding back degeneratively the output of the peak detector to the base terminal and stabilizing the direct current level in the said power transistor against thermally induced variations thereof.

9. The network of claim 8 in which the peak detector includes a control amplifier at the output side of the said peak detector.

10. The network of claim 8 in which the peak detector comprises the base to emitter interaction of a control transistor, capacitive means, and means for connecting said capacitive means with the emitter of said control transistor.

11. The bias control network of claim 10 which includes overdrive protection comprising, an avalanche diode with its first terminal connected to the output side of the differential amplifier, an overdrive protection transistor whose base is connected to the second terminal of the avalanche diode, and means to connect a high current carrying terminal of the said overdrive protection transistor to the collector terminal of the control transistor.

12. A signal pulse power transistor circuit with stabilized base bias, comprising:

(a) the network of claim 8;
(b) the power transistor;
(c) means for connecting a high current-carrying terminal of the power transistor to the sensing means; and
(d) means for connecting the output side of the peak detector to the base of the power transistor.

13. A signal power transistor amplifier circuit with stabilized base bias, comprising:

(a) the circuit of claim 12;
(b) a signal input network;
(c) means for connecting the signal input network to the base of the power transistor;
(d) an output utilization load; and
(e) means for connecting the load to the power transistor.

References Cited

UNITED STATES PATENTS

| | | | |
|---|---|---|---|
| 3,432,763 | 3/1969 | Ingman | 330—25 |
| 3,399,339 | 8/1968 | Yeager | 323—22 |

ROY LAKE, Primary Examiner

LAWRENCE J. DAHL, Assistant Examiner

U.S. Cl. X.R.

330—30